United States Patent
Takamatsu et al.

(10) Patent No.: US 6,624,458 B2
(45) Date of Patent: Sep. 23, 2003

(54) SEMICONDUCTOR DEVICE HAVING A FERROELECTRIC CAPACITOR AND FABRICATION PROCESS THEREOF

(75) Inventors: Tomohiro Takamatsu, Kawasaki (JP); Ko Nakamura, Kawasaki (JP); Katsuyoshi Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/962,452

(22) Filed: Sep. 26, 2001

(65) Prior Publication Data

US 2002/0185668 A1 Dec. 12, 2002

(30) Foreign Application Priority Data

Apr. 25, 2001 (JP) ......................... 2001-128373

(51) Int. Cl.⁷ ............................. H01L 31/119
(52) U.S. Cl. ...................... 257/295; 257/310; 438/3; 365/145
(58) Field of Search ................ 257/295, 310; 365/145; 438/3

(56) References Cited

U.S. PATENT DOCUMENTS 5,554,866 A * 9/1996 Nishioka et al. ............ 257/295
5,790,366 A * 8/1998 Desu et al. ................. 361/305
6,169,305 B1 * 1/2001 Takai et al. ................ 257/295
2001/0019143 A1 * 9/2001 Koo et al. .................. 257/296
2002/0074581 A1 * 6/2002 Black et al. ................ 257/295

FOREIGN PATENT DOCUMENTS

JP  10-12830      1/1998
JP  2000156471 A * 6/2000 ....... H01L/21/8242

OTHER PUBLICATIONS

Corresponding U.S. application Ser. No. 09/797,005 entitled: Process for Producing a Strontium Ruthenium Oxide Protective Layer on a Top Electrode.

* cited by examiner

Primary Examiner—Allan R. Wilson
Assistant Examiner—Matthew C Landau
(74) Attorney, Agent, or Firm—Armstrong, Westerman & Hattori, LLP

(57) ABSTRACT

A semiconductor device has a ferroelectric capacitor including a ferroelectric film provided on a lower electrode and an upper electrode provided on the ferroelectric film, wherein the upper electrode is formed of a first layer of a non-stoichiometric oxide and a second layer of a non-stoichiometric or stoichiometric oxide provided on the first layer, the second oxide having a composition closer to the stoichiometric composition as compared with the first layer.

13 Claims, 13 Drawing Sheets

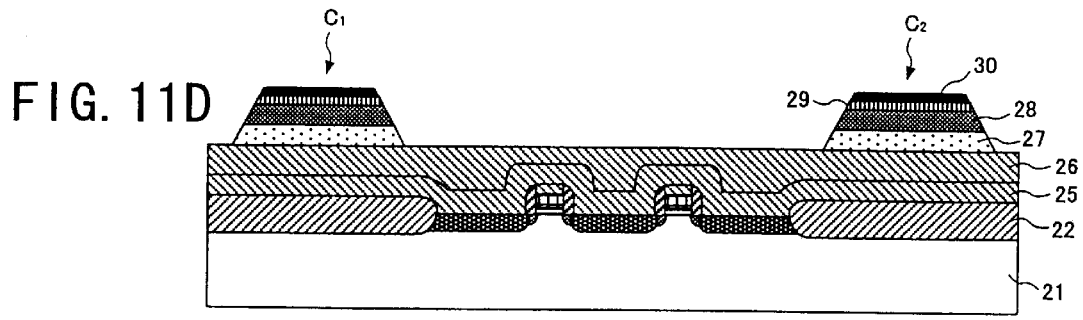
FIG. 11D
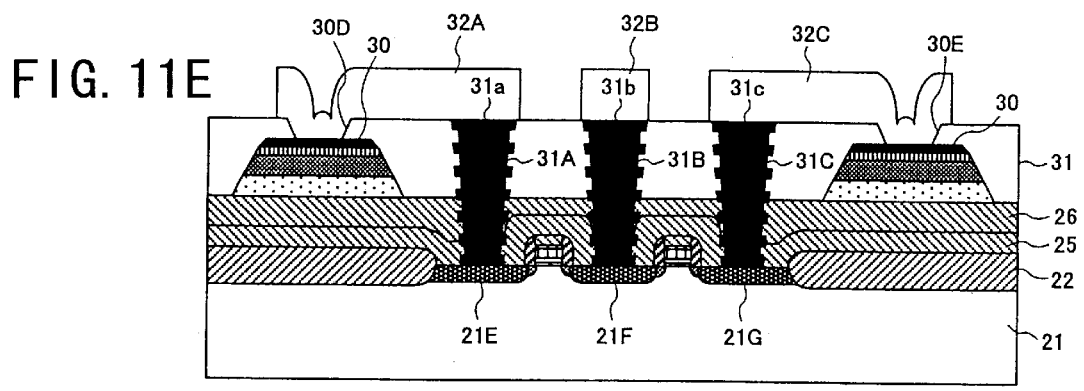
FIG. 11E
FIG. 12
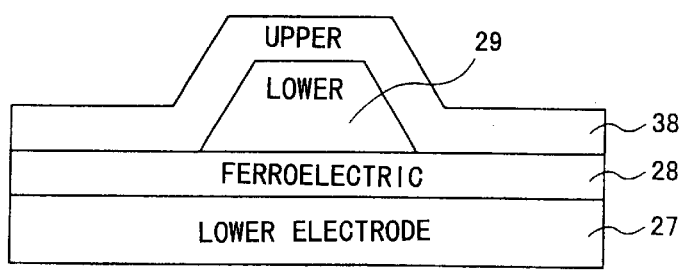

US 6,624,458 B2

SEMICONDUCTOR DEVICE HAVING A FERROELECTRIC CAPACITOR AND FABRICATION PROCESS THEREOF

CROSS-REFERENCE TO RELATED APPLICATION

The present application is based on Japanese priority application No.2001-128373 filed on Apr. 25, 2001, the entire contents of which are hereby incorporated by reference.

BACKGROUND OF THE INVENTION

The present invention generally relates to semiconductor devices and more particularly to a semiconductor device having a ferroelectric capacitor and the process of fabricating the same.

A ferroelectric memory device (FeRAM) is a non-volatile semiconductor memory device that can hold information even when the electric power is turned off. In an FeRAM, writing of information is achieved by utilizing the hysteresis of ferroelectrics.

A typical FeRAM has a ferroelectric capacitor in which a ferroelectric film is sandwiched by a pair of electrodes, and information is written into the ferroelectric film by causing a polarization therein in response to application of an electric voltage across the electrodes. The information thus written into the ferroelectric film in the form of spontaneous polarization is retained even when the application of the electric voltage is terminated.

In such a ferroelectric capacitor, the polarity of the spontaneous polarization is reversed when the polarity of the applied voltage is inverted. Thus, by detecting the direction of the spontaneous polarization, it becomes possible to read out the written information.

An FeRAM can be operated with a lower driving voltage as compared with the case of a flash memory, but with much higher speed and with much lower electrical power consumption.

In the fabrication process of an FeRAM, it is necessary to conduct thermal annealing processes in an oxygen atmosphere repeatedly for recovering degradation of characteristics of the ferroelectric film, which occurs as a result of processing conducted in a non-oxidizing atmosphere. It should be noted that the ferroelectric film constituting the ferroelectric capacitor easily undergoes formation of oxygen defects when exposed to a non-oxidizing atmosphere. Associated with this, the characteristics of the ferroelectric film such as switching electric charge, leakage current, the like, are degraded altogether.

In view of the use of the oxygen atmosphere, conventional FeRAMs have used a metal not susceptible to oxidation in an oxygen atmosphere, such as Pt, $IrO_x$, $RuO_x$, or other conductive oxides, for the upper electrode.

Meanwhile, FeRAMs are subjected to severe demand of device miniaturization similarly to other semiconductor devices. Associated with this, there are demands for miniaturization of the ferroelectric capacitor. Further, there are demands for using a multilayer interconnection structure also in FeRAMs. Furthermore, there are demands of low voltage operation for FeRAMs, particularly in relation to application for mobile information processing.

In order to achieve a low-voltage operation for an FeRAM, it is necessary that the ferroelectric film constituting the ferroelectric capacitor has a large switching electric charge $Q_{SW}$. In the case that a multilayer interconnection structure is used, however, there arises a problem in that the characteristic of the ferroelectric capacitor undergoes serious degradation as a result of the processes used for forming the multilayer interconnection structure. It should be noted that these processes for forming a multilayer interconnection structure have to be conducted under a reducing atmosphere or under a non-oxidizing atmosphere.

More specifically, in the case the upper electrode is formed of a Pt film or an Ir film, or the like, hydrogen contained the reducing atmosphere invades into the Pt film or the Ir film and undergoes activation by the catalytic action of these metals at the time of forming an interlayer insulation in the multilayer interconnection structure. Thereby, there arises a problem in that the ferroelectric film in the ferroelectric capacitor is reduced by the hydrogen radicals that have been thus activated. When the ferroelectric film undergoes such a reduction, the operational characteristics of the ferroelectric capacitor are degraded seriously as noted before. This problem of degradation of the characteristics of the ferroelectric film appears particularly conspicuously when the ferroelectric capacitor is miniaturized and the capacitor insulation film in the ferroelectric capacitor is formed of a miniaturized ferroelectric pattern.

SUMMARY OF THE INVENTION

Accordingly, it is a general object of the present invention to provide a novel and useful semiconductor device having a ferroelectric capacitor and the process of making the same, wherein the foregoing problems are eliminated.

Another and more specific object of the present invention is to provide a fabrication process of a semiconductor device having a ferroelectric capacitor enabling miniaturization the ferroelectric capacitor while suppressing the degradation of electric characteristics of a ferroelectric film in the ferroelectric capacitor and simultaneously enabling formation of a multilayer interconnection structure on the ferroelectric capacitor.

Another object of the present invention is to provide a semiconductor device, comprising:

a substrate; and a ferroelectric capacitor provided over said substrate, said ferroelectric capacitor comprising a lower electrode, a ferroelectric film provided over said lower electrode, and an upper electrode provided over said ferroelectric film, said upper electrode comprising: a first layer of an oxide having a stoichiometric composition represented by a formula $AO_{x1}$ by using a compositional parameter $x_1$ and an actual composition represented by a formula $AO_{x2}$ by using a compositional parameter $x_2$; and a second layer provided on said first layer and having a stoichiometric composition represented by a formula $BO_{y1}$ by using a compositional parameter $y_1$ and an actual composition represented by a formula $BO_{y2}$ by using a compositional parameter $y_2$, wherein there holds a relationship $$y_2/y_1 > x_2/x_1.$$

Another object of the present invention is to provide a fabrication process of a semiconductor device, comprising the steps of:

forming a lower electrode;

depositing a ferroelectric film on said lower electrode;

depositing a first conductive oxide film on said ferroelectric film; and depositing a second conductive oxide film on said first conductive oxide film, wherein said step of depositing said first conductive oxide film is conducted under a less oxidizing condition as compared with said step of depositing said second conductive oxide film.

According to the present invention, there occurs a diffusion of Pb into the lower layer part of the upper electrode from the ferroelectric film as a result of the use of the first conductive oxide film having a non-stoichiometric composition for the lower layer part of the upper electrode. It should be noted that the lower layer part of the upper electrode makes a contact with the ferroelectric film forming the capacitor insulation film of the ferroelectric capacitor. As a result, the interface between the ferroelectric film and the lower layer part of the upper electrode is effectively palanarized, and the effective voltage applied to the ferroelectric film is increased when a voltage is applied across the ferroelectric capacitor. On the other hand, such a conductive oxide film having a non-stoichiometric composition causes a problem, when exposed to an atmosphere containing hydrogen, in that the metallic components contained in the film cause activation of hydrogen in the atmosphere, and the hydrogen thus activated induces degradation of characteristics of the ferroelectric film. Because of this, the present invention forms the upper layer part of the upper electrode layer located on the lower layer part of the upper electrode layer, by using the second conductive oxide film having a stoichiometric composition or a composition closer to the stoichiometric composition than the first conductive oxide film. In this way, the penetration of the reducing atmosphere to the lower layer part of the upper electrode is effectively blocked.

According to the present invention, miniaturization of a ferroelectric capacitor can be realized in an FeRAM having a multilayer interconnection structure while suppressing the degradation of the ferroelectric film.

Other objects and further features of the present invention will become apparent from the following detailed description when read in conjunction with the attached drawings.

BRIEF DESCRIPTION OF THE DRAWINGS

FIGS. 11A–11E are diagrams showing the fabrication process of an FeRAM according to a second embodiment of the present invention; and FIG. 12 is a diagram showing a modification of the second embodiment.

DETAILED DESCRIPTION OF THE INVENTION

[First Embodiment]

The inventor of the present invention made the following discovery that constitutes the foundation of the present invention in a series of experimental investigations conducted on ferroelectric capacitors. In the investigation, experiments were made to form ferroelectric capacitors by forming a PZT film on a lower electrode of a Pt/Ti structure as a capacitor insulation film and further forming an $IrO_x$ film thereon as an upper electrode.

Hereinafter, the experiments conducted by the inventor of the present invention will be explained with reference to FIGS. 1A–1F as the fabrication process of a ferroelectric capacitor according to a first embodiment of the present invention.

Figure 1A:
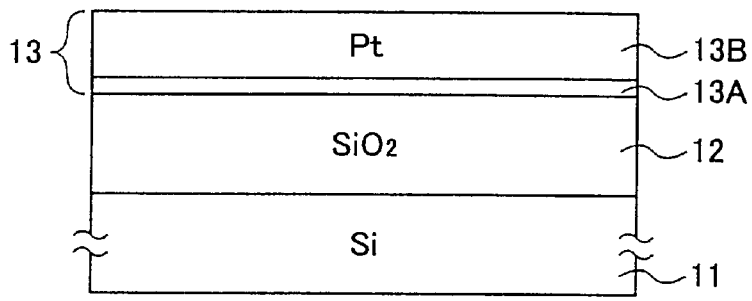
FIGS. 1A–1F are the diagrams showing the fabrication process of a ferroelectric capacitor according to a first embodiment of the present invention.

Referring to FIG. 1A, a Ti film 13A and a Pt film 13B are deposited consecutively on an $SiO_2$ film 12 covering an Si substrate 11 with a thickness of 1000 nm, by a sputtering process with respective thicknesses of 20 nm and 175 nm. With this, a lower electrode layer 13 is formed.

Figure 1B:
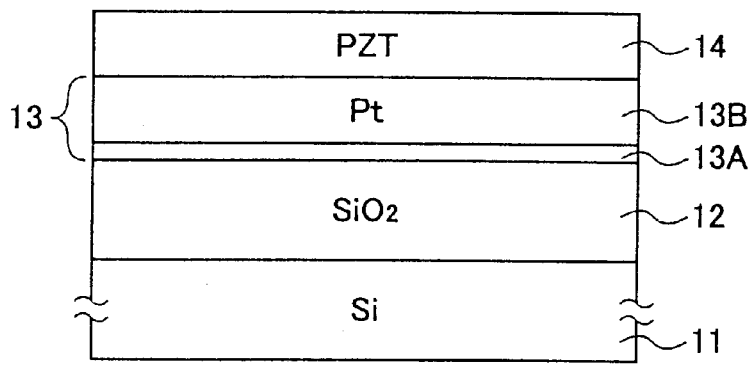
Figure 1C:
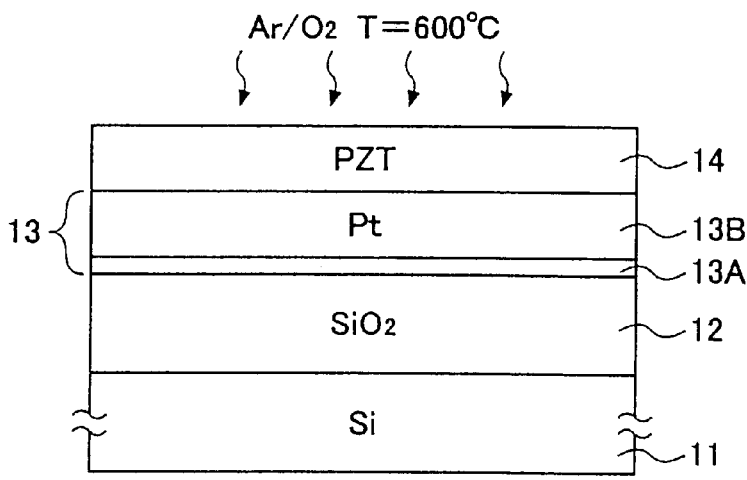

Next, in the step of FIG. 1B, a PZT film 14 is formed on the lower electrode 13 as a ferroelectric capacitor insulation film with a thickness of about 200 nm by an RF sputtering process. The PZT film 14 thus deposited is then subjected to a rapid thermal annealing (RTA) process at a temperature of about 600° C. in an $Ar/O_2$ atmosphere in the step of FIG. 1C. As a result, the PZT film 14 undergoes partial crystallization.

Figure 1D:
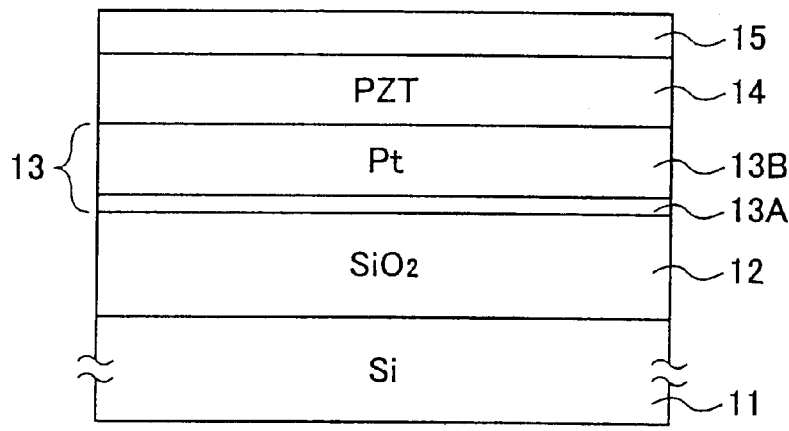
Figure 1E:
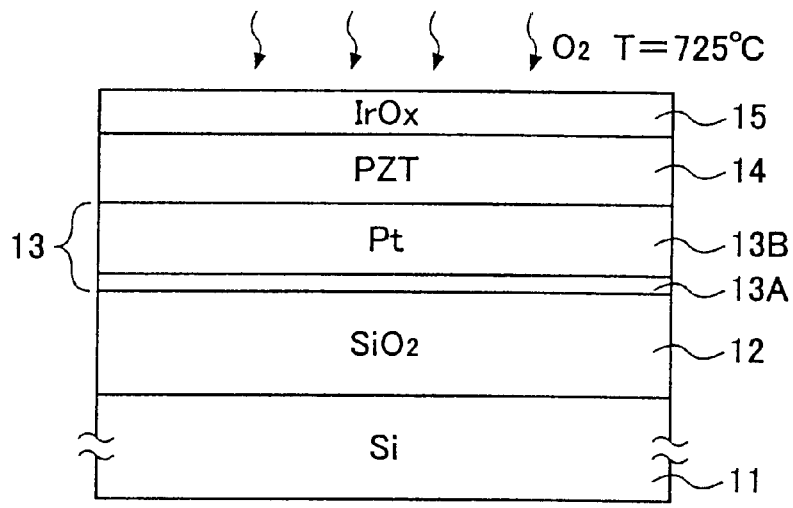

Next, in the step of FIG. 1D, a first $IrO_x$ film 15 is formed on the PZT film 14 with a thickness of about 100 nm by conducting a reactive sputtering process under the condition summarized in Table 1 below, while using a target of Ir. Further, in the step of FIG. 1E, a second rapid thermal annealing process is applied at the temperature of about 725 degree C. in an $O_2$ atmosphere. As a result of the second rapid thermal annealing process, the PZT film 14 undergoes a full crystallization. Simultaneously, the oxygen defects in the PZT film 14 are compensated.

TABLE 1

| power | 1–4 kW |
|---|---|
| Ar flow rate | 50–150 SCCM |
| O2 flow rate | 30–80 SCCM |
| substrate temperature | room temperature - 100° C. |

Figure 1F:
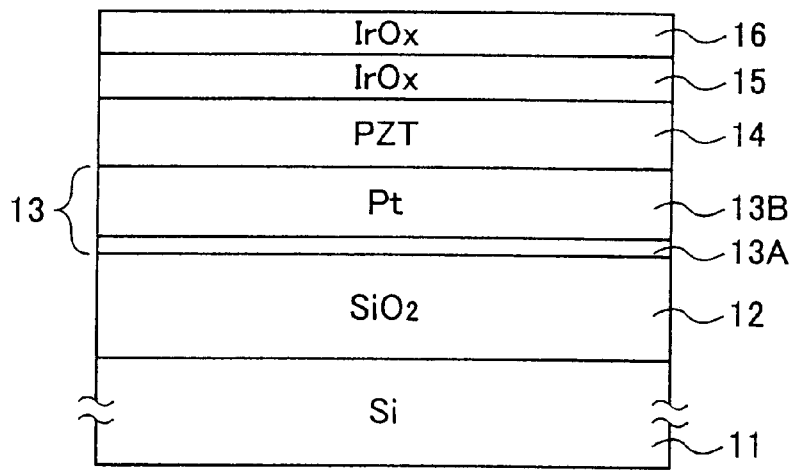

Next, in the step of FIG. 1F, a second $IrO_x$ film 16 is formed on the $IrO_x$ film 15 with a thickness of about 100 nm by using a reactive sputtering process under a condition summarized in Table 2 while using a target of Ir. The $IrO_x$ film 15 and the $IrO_x$ film 16 thus formed constitute together the upper electrode of the ferroelectric capacitor. Hereinafter, the ferroelectric capacitor sample having the layered structure of the $IrO_x$ films 15 and 16 in the upper electrode will be referred to as "Layered Structure."

TABLE 2

| power | 0.5–2 kW |
|---|---|
| Ar flow rate | 50–150 SCCM |
| O2 flow rate | 80–200 SCCM |
| substrate temperature | room temperature - 500° C. |

Table 3 below shows the result of examination made on the degree of oxidation of the $IrO_x$ film 15 constituting the lower layer part of the upper electrode and the $IrO_x$ film 16 constituting the upper layer part of the upper electrode, wherein the examination is made with reference to the stoichiometric $IrO_2$ composition (x=2) by using an RBS (Rutherford Background Scattering) method.

TABLE 3

| | depo-condition | IrOx |
|---|---|---|
| IrOx film 15 | Ar:O2 = 1.0:0.6 | x = 1.4 |
| IrOx film 16 | Ar:O2 = 1.0:1.0 | x = 2.0 |

As can be seen in Table 3, the $IrO_x$ film 16 located above the $IrO_x$ film 15 has a much higher degree of oxidation as compared with the $IrO_x$ film 15 in the ferroelectric capacitor thus formed. Especially, it can be seen that the $IrO_x$ film 16 constituting the upper layer part of the upper electrode has a nearly ideal stoichiometric composition.

Further, according to the experiments conducted by the inventor of the present invention, a ferroelectric capacitor sample was prepared by providing a single layer $IrO_x$ film on the PZT film 14 as the upper electrode with a thickness of 200 nm under the condition listed in Table 1. In addition, a reference ferroelectric capacitor sample was prepared in which a single layer $IrO_x$ film was formed on the PZT film 14 as the upper electrode with the thickness of 200 nm under the condition listed in Table 2. In the description hereinafter, the former ferroelectric capacitor sample will be designated as "x=1.4," while the ferroelectric capacitor of the latter will be designated as "x=2.0."

The inventor of the present invention has then patterned the ferroelectric capacitor thus formed to a size of 50 $\mu$m×50 $\mu$m and measured the capacitor characteristics.

Figure 2:
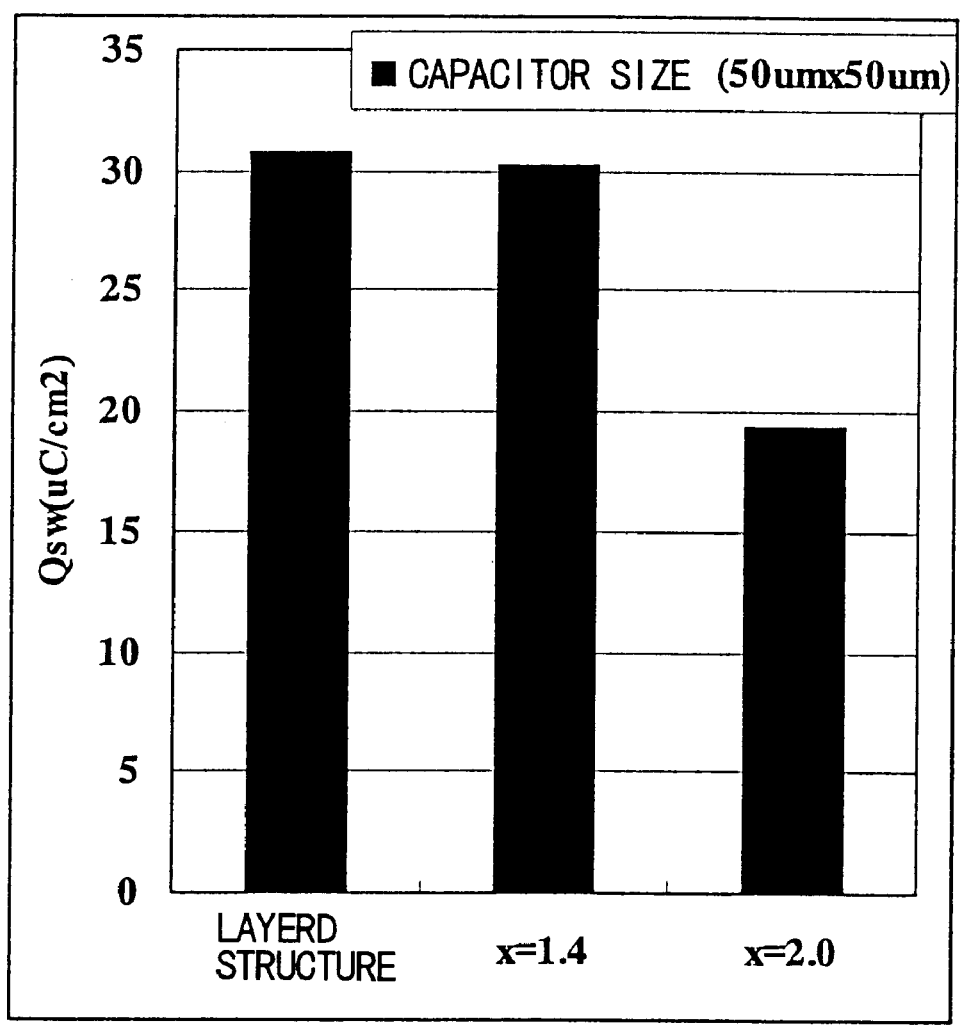
FIG. 2 is a diagram showing the electric characteristic of the ferroelectric capacitor of the first embodiment.

FIG. 2 shows the capacitor characteristic thus obtained.

Referring to FIG. 2, it can be seen that the value of the switching electric charge $Q_{SW}$, which indicates the degree of polarization in the capacitor, exceeds the value of 30 $\mu$C/cm$^2$ in the state when a voltage of 3 V is applied to the capacitor, for the case of the sample of "Layered Structure" and for the case of the sample of "x=1.4." On the other hand, it can be seen that the value of $Q_{SW}$ is only about 20 $\mu$C/cm$^2$ for the case of the sample in which there is provided only the $IrO_x$ layer of x=2.0 for the upper electrode. The result of FIG. 2 clearly indicates that the ferroelectric capacitor sample of "x=2.0" cannot be used for an FeRAM for low voltage applications. Further, the result of FIG. 2 indicates that the capacitor characteristics can be improved by using an $IrO_x$ film having a small degree of oxidation, and hence containing a large amount of oxygen defects, for the upper electrode of the ferroelectric capacitor. The mechanism of such a phenomenon will be explained later in the specification.

Figure 3:
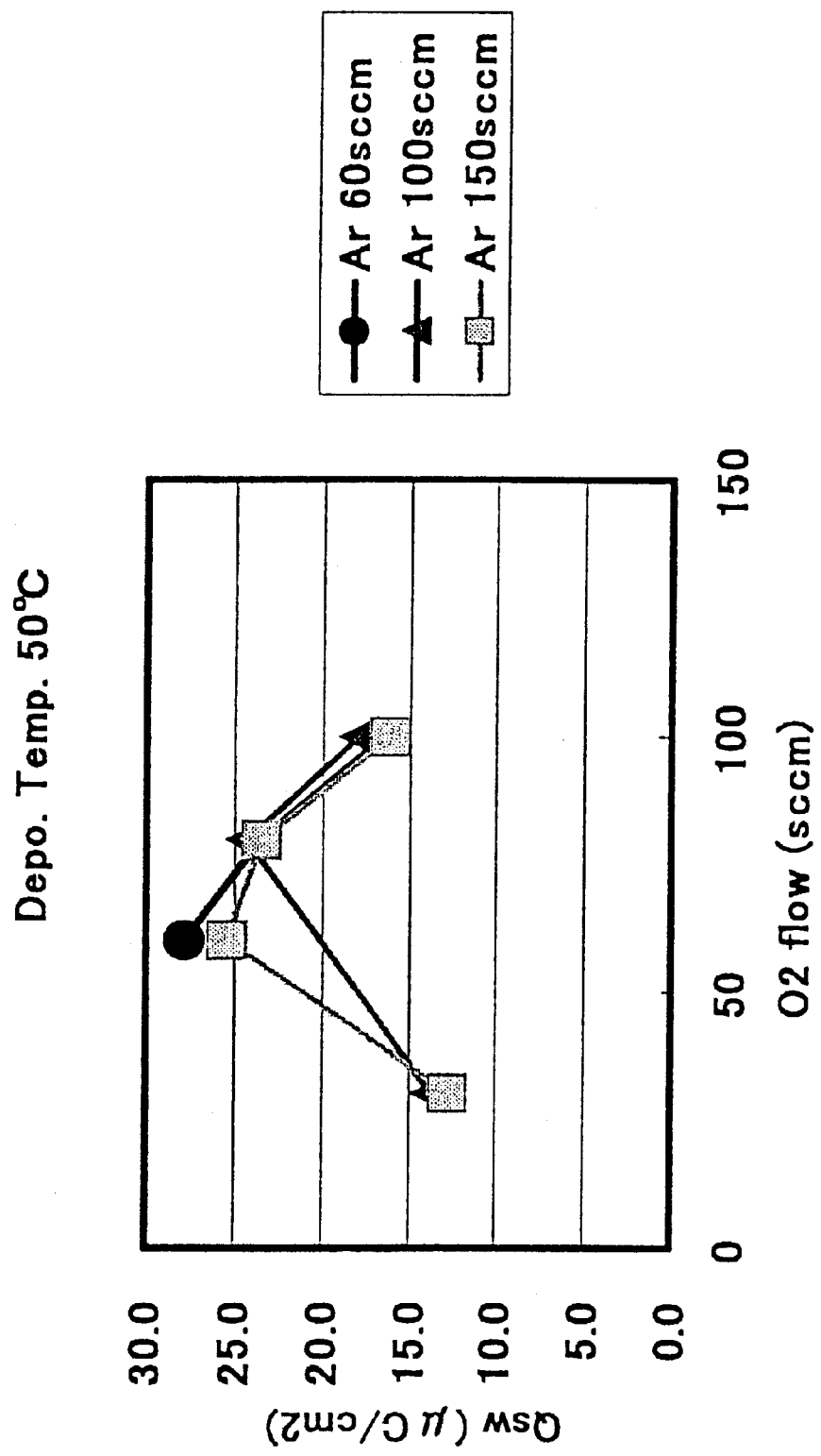
FIG. 3 is a diagram showing the relationship between the sputtering atmosphere used at the time of formation of the IrOx upper electrode and the electric characteristic of the ferroelectric capacitor.

FIG. 3 shows the relationship between the atmosphere used in the experiment of FIG. 2 at the time of the sputtering process of the $IrO_x$ film and the switching electric charge $Q_{SW}$ of the PZT film. It should be noted that the experiments shown in FIG. 3 correspond to the sample "x=1.4" and the sample "x=2.0" of FIG. 2. In both cases, a single layer of $IrO_x$ film was deposited with a thickness of 200 nm for the upper electrode at the temperature of 50° C.

Referring to FIG. 3, in the case the $O_2$ flow-rate is set to about 60 SCCM at the time of the sputtering process ("x=1.4"), the switching electric charge $Q_{SW}$ of the PZT film takes a value of about 25.0 $\mu$C/cm$^2$ or more as long as the Ar flow-rate is set to the range of 60–150 SCCM. On the other hand, in the case the $O_2$ flow-rate is set to about 100 SCCM ("x=2.0"), it can be seen that the switching electric charge $Q_{SW}$ is decreased to 15–17 $\mu$C/cm$^2$.

Figure 4:
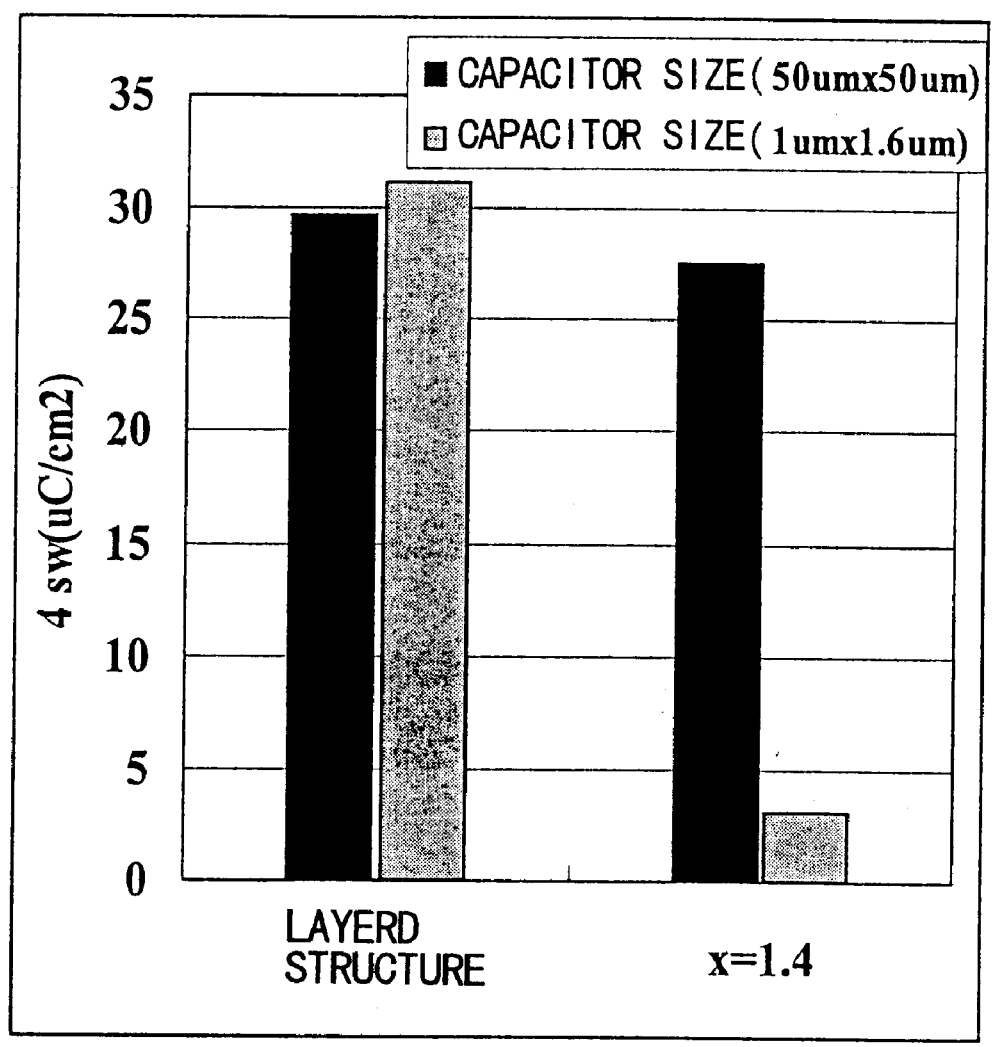
FIG. 4 is a diagram showing the electric characteristic of the ferroelectric capacitor of the first embodiment.

FIG. 4 shows the result of measurement of the electric properties of the ferroelectric capacitor for the case in which a three-layer interconnection structure of A1 is formed on the ferroelectric capacitor for the sample "Layered Structure" and for the sample "x=1.4," after patterning the same to the size of 50 $\mu$m×50 $\mu$m and 1.0 $\mu$m×1.6 $\mu$m.

Referring to FIG. 4, it can be seen that there is no material difference in the electric characteristics between the sample "Layered Structure" and the sample "x=1.4," as long as the capacitor is patterned to the size of 50 $\mu$m×50 $\mu$m. Further, it can be seen that the value of the switching electric charge $Q_{SW}$ does not change substantially for the capacitor of the sample "Layered Structure" when the capacitor is patterned to the size of 1.0 $\mu$m×1.6 $\mu$m and when the capacitor is patterned to the size of 50 $\mu$m×50 $\mu$m. On the other hand, it can be seen that the value of the switching electric charge $Q_{SW}$ is decreased to almost 0 $\mu$C/cm$^2$ in the sample of "x=1.4" when the capacitor is patterned to the size of 1 $\mu$m×1.6 $\mu$m. The foregoing result of FIG. 4 indicates that the PZT film 14 undergoes a severe degradation as a result of damages caused at the time of formation of the multilayer interconnection structure. It should be noted that the formation of the multilayer interconnection structure is carried out after the formation of the capacitor. Further, the result of FIG. 4 clearly indicates that the degradation is enhanced with the miniaturization of the capacitor size.

From the result of FIGS. 2–4, it is concluded that the ferroelectric capacitors formed under the condition corresponding to the sample of "x=2.0" or "x=1.4" cannot be used for practical applications in which the semiconductor device is subjected to miniaturization and used in combination with a multilayer interconnection structure.

The result of FIG. 4 further indicates that it is advantageous to form the upper electrode by laminating the $IrO_x$ film 16 on the $IrO_x$ layer 15 (x=1.4) with the compositional parameter x for the $IrO_x$ film 16 set to be larger than 1.4 (x>1.4), preferably with a composition near the stoichiometric composition (x=2), in order to realize a ferroelectric capacitor resistant to damages caused by the processes conducted after the formation of the ferroelectric capacitor, such as the one caused by the process of forming of the multilayer interconnection structure.

It is believed that the foregoing results have been caused by a mechanism as follows.

It is well known that metallic state Ir functions as a hydrogen catalyst, and thus, there occurs activation of hydrogen when hydrogen is caused to make a contact with metallic state Ir. On the other hand, it should be noted that there exist oxygen defects in the $IrO_x$ film 15 (x=1.4). In the $IrO_x$ film 15, the compositional parameter x has a value smaller than the stoichiometric value of x=2.0. In such a non-stoichiometric $IrO_x$ film 15, therefore, there exist both oxide components and metallic components in the $IrO_x$ film 15, and there would occur extensive activation of hydrogen in the process of forming the interlayer insulation film or in the process of forming the interconnection pattern, when the entire upper electrode was formed of the IrOx film 15. In such a case, the capacitor characteristics would experience severe degradation by the hydrogen radicals thus activated.

On the other hand, there are few oxygen defects in the $IrO_x$ film 16 (x=2) that has a nearly stoichiometric composition. Because of the fact that the $IrO_x$ film 16 is substantially free from metallic Ir component, there would occur no such an activation of hydrogen in the $IrO_x$ film 16 and the initial capacitor characteristic would be maintained without substantial degradation even after the formation of the multilayer interconnection structure on the ferroelectric capacitor when the entire upper electrode was formed of the $IrO_x$ film 16.

Figure 5A:
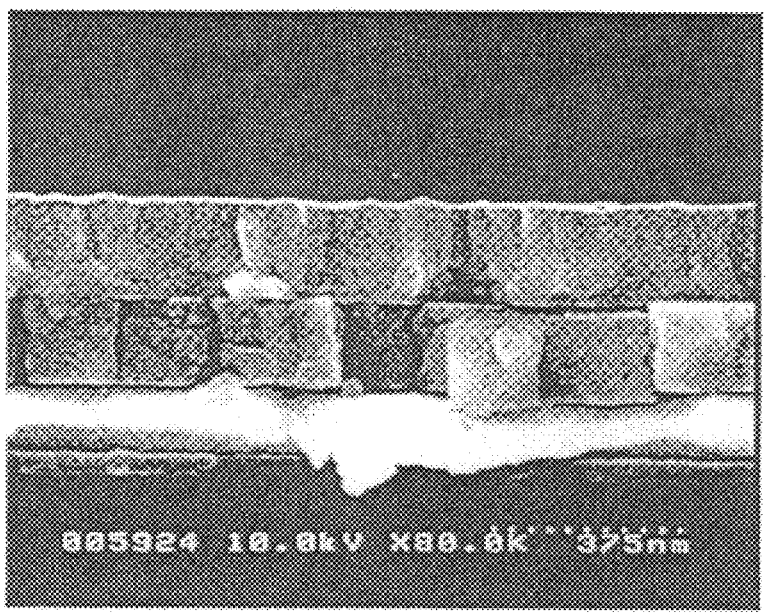
FIGS. 5A and 5B are diagrams showing an SEM image of the cross-sectional structure of the ferroelectric capacitor of the first embodiment.
Figure 5B:
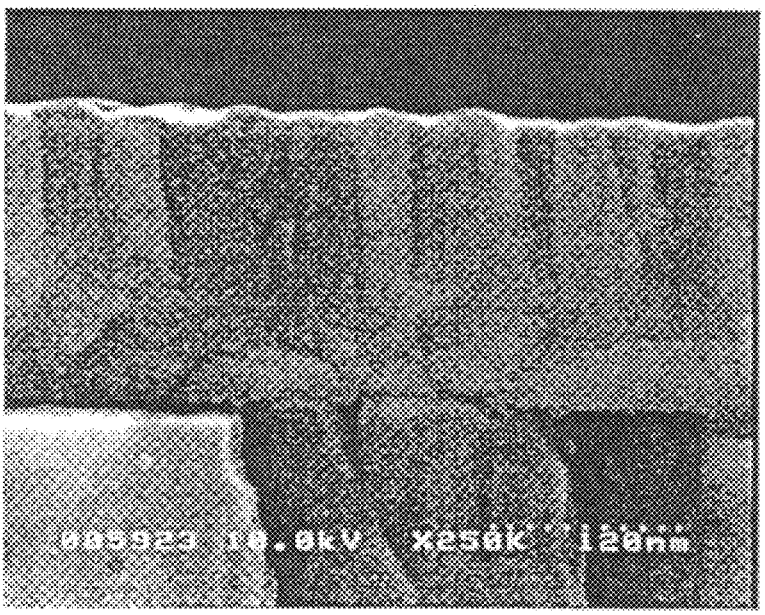

FIGS. 5A and 5B are SEM photographs showing the cross-sectional structure of the ferroelectric capacitor having the "Layered Structure", wherein it should be noted that FIG. 5B shows a part of FIG. 5A in an enlarged scale. Further, FIG. 6 shows a sketch of the photograph of FIG. 5B.

Figure 6:
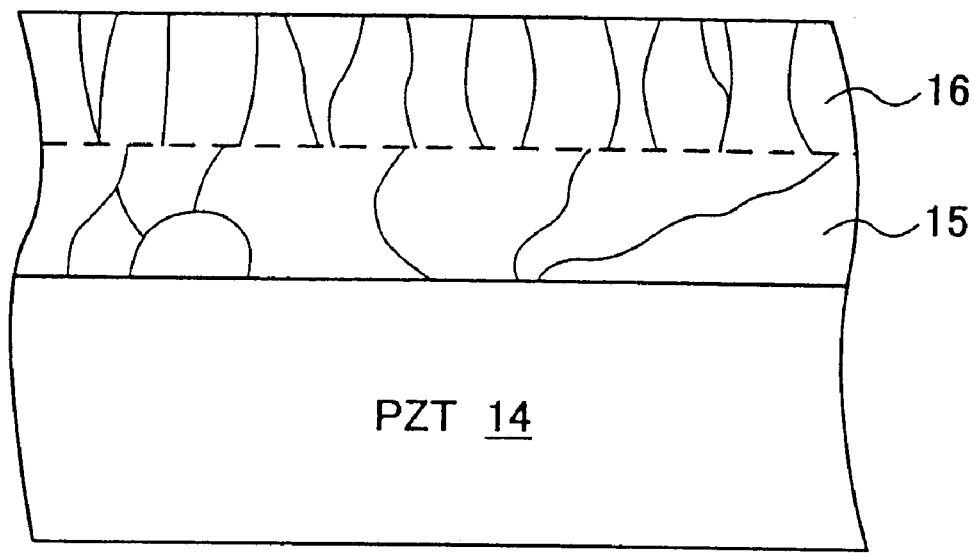
FIG. 6 is a diagram showing a sketch of the cross-sectional structure of FIG. 5B.

Referring to FIGS. 5A and 5B and FIG. 6, it can be seen that the upper electrode formed on the PZT film 14 is composed with the $IrO_x$ layer 15 (x=1.4) having a thickness of about 100 nm and further with the $IrO_x$ layer 16 of the same thickness of about 100 nm, while it can be seen also that the $IrO_x$ layer 15 has a granular microstructure characterized by a grain size of about 100 nm. On the other hand, the $IrO_x$ film 16 has a columnar microstructure composed of columnar crystals having a grain size of 20–50 nm.

As explained previously, the compound $IrO_x$ easily undergoes reduction to metallic state Ir when exposed to a hydrogen atmosphere. Once this occurs, there is caused an activation of hydrogen radicals due to the catalytic action pertinent to the metallic state Ir, and the capacitor characteristic is degraded severely. Contrary to this, the columnar crystals forming the $IrO_x$ layer 16 are energetically more stable as compared with $IrO_x$ of other structures, and because of this, the $IrO_x$ layer 16 having a columnar microstructure therein shows excellent resistance against reduction. Thus, the damages caused by the reducing atmosphere to the capacitor can be suppressed effectively by providing the $IrO_x$ film 16 on the $IrO_x$ film 15 in the ferroelectric capacitor of the present embodiment.

Figure 7A:
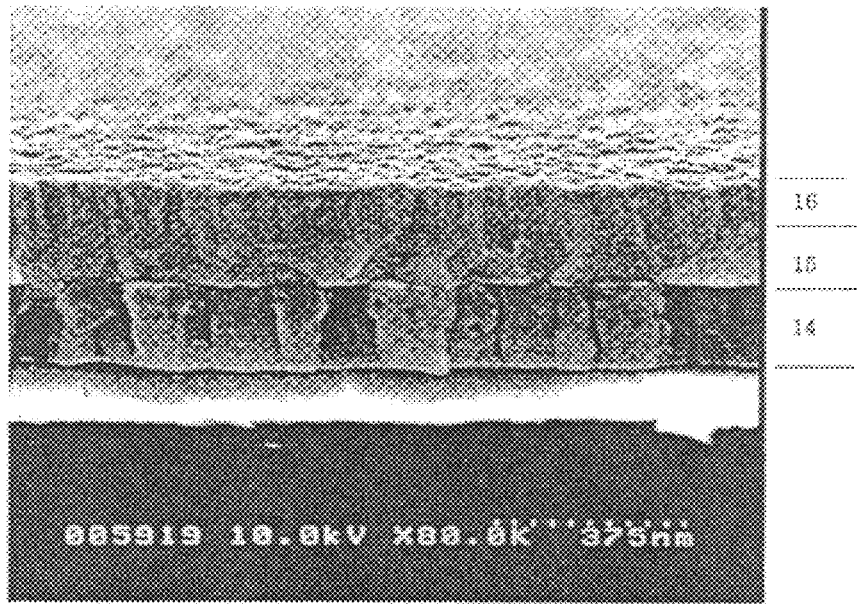
FIGS. 7A and 7B are diagrams showing SEM images of the cross-sectional structure of the ferroelectric capacitors of the present embodiment formed with different process conditions.
Figure 7B:
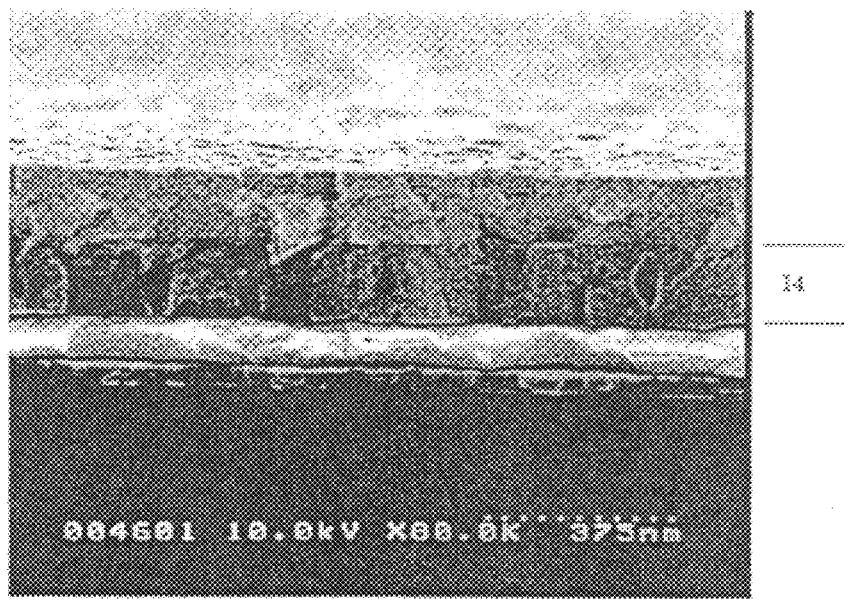

FIGS. 7A and 7B show the cross-sectional SEM photograph of the upper electrode of FIG. 5B having the layered structure, for the case in which the thickness ratio of the $IrO_x$ film 15 to the $IrO_x$ film 16 is changed. It should be noted that FIG. 7A corresponds to the structure of FIGS. 5A and 5B and shows the case in which the $IrO_x$ film 15, formed to the thickness of 100 nm, is subjected to a rapid thermal annealing process at 725° C. for 20 seconds, followed by the process of forming the $IrO_x$ film 16 on the $IrO_x$ film 15 with the thickness of 100 nm. On the other hand, FIG. 7B shows the case in which the $IrO_x$ film 15 is subjected to a rapid thermal annealing process at 725° C. for 20 seconds after being formed to the thickness of about 150 nm and the $IrO_x$ film 16 is formed thereafter to the thickness of 50 nm.

Referring to FIGS. 7A and 7B, the PZT film 14 has a columnar microstructure in the structure of FIG. 7A, and no large defects such as pores are recognized. Contrary to this, in the structure of FIG. 7B, while the PZT film 14 has a generally columnar microstructure, it is observed that there are formed a number of conspicuous pores in the PZT film 14. A ferroelectric capacitor that includes such large pores in the ferroelectric film 14 is defective and cannot be used for an FeRAM. From the result of FIGS. 7A and 8B, it is concluded that the thickness of the $IrO_x$ film 15 is preferably smaller than 100 nm.

In any of FIGS. 5A and 5B or FIGS. 7A and 8B, it should be noted that there is obtained a flat, perfectly planarized interface between the PZT film 14 and the $IrO_x$ film 15 thereon. No irregularities caused by crystal grain boundaries are observed. It should be noted that such a structure having a flat interface between the PZT film 14 and the $IrO_x$ film 15 appears characteristically when the PZT film 14 is crystallized partially by the first rapid thermal annealing process conducted at the first, lower temperature as in the step of FIG. 1C and then fully crystallized by the second rapid thermal annealing process conducted in the second, higher temperature in the step of FIG. 1F, in the state that the PZT film 14 is covered by the IrOx film 15 in the step of FIG. 1E.

Figure 8A:
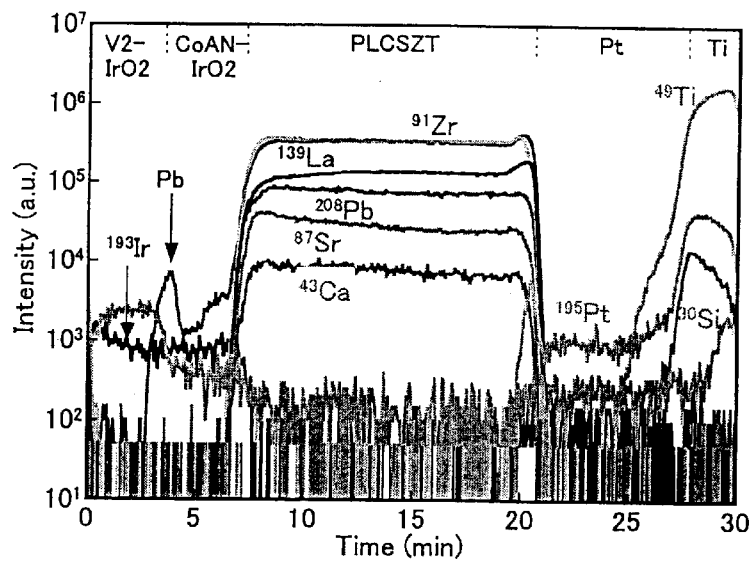
FIGS. 8A and 8B are diagrams showing the distribution profile of elements in the ferroelectric capacitor of the present embodiment, in comparison with the distribution profile of elements a reference ferroelectric capacitor sample.

FIG. 8A shows the result of the SIMS analysis conducted on the ferroelectric capacitor having the upper electrode of layered structure (corresponding to the sample "Layered Structure" noted before), while FIG. 8B shows the result of the SIMS analysis for the ferroelectric capacitor that uses only the $IrO_x$ film with x=1.4 (corresponding to the sample "x=1.4" noted before) for the upper electrode.

Referring to FIG. 8A, it can be seen that there occurs an extensive diffusion ofPb from the PZT film 14 to the frOx film 15 forming the lower layer part of the upper electrode in the sample designated as "Layered Structure", while the Pb concentration level in the frOx film 16 forming the upper layer part of the upper electrode is smaller than the detection limit in the same sample. From this, it is concluded that there occurs no diffusion ofPb into the IrOx film 16. In FIG. 8A, it is noted that there exists a concentration of Pb at the interface between the upper IrOx film 16 and the lower IrOx film 15 in FIG. 8A, while this is merely an artifact caused by a sudden change of film quality at the interface between the films 15 and 16. There is no actual concentration of Pb at the interface between the films 15 and 16.

Figure 8B:
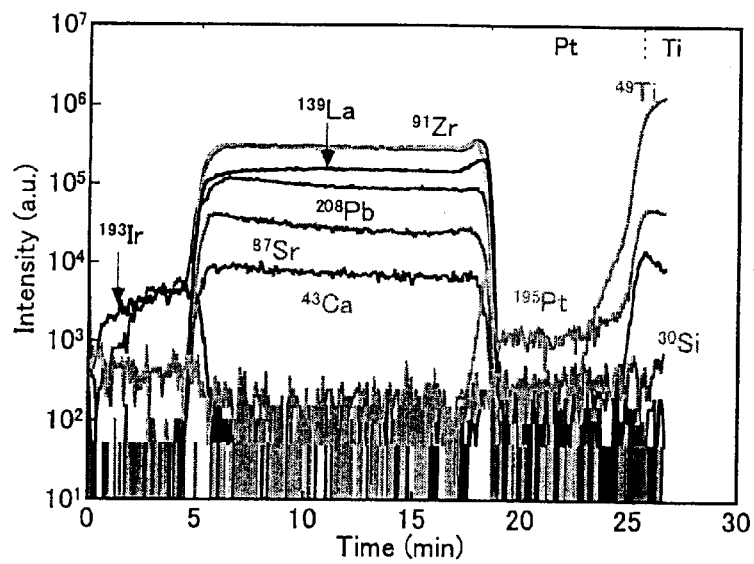

On the other hand, in the sample "x=1.4" shown in FIG. 8B, it can be seen that Pb has reached the surface of the $IrO_x$ film 15. Further, in view of the fact that the concentration level of Pb in the $IrO_x$ film 16 of FIG. 8A is smaller than the detection limit in the case of the sample of "x=2.0" explained previously with reference to FIG. 2, it is considered that Pb is not penetrating into the upper layer part of the upper electrode formed of the $IrO_x$ film 16 having the composition of x=2.0.

Meanwhile, the result of FIG. 2 shown before indicates that there has been achieved an improvement in the characteristic of the ferroelectric capacitor in spite of the fact that there is caused an extensive diffusion of Pb from the PZT film 14 into the $IrO_x$ film 15. The mechanism of this phenomenon is thought as follows.

As mentioned before, the IrOx film 15 (x=1.4) contains oxygen defects with high concentration. Thus, there easily occurs diffusion of Pb in such an $IrO_x$ film 15 via the vacancies formed by the oxygen defects. As a result, excessive Pb atoms introduced into the PZT film 14 in advance cause a diffusion into the $IrO_x$ film 15, and because of this, it is believed that there occurs the foregoing planarization of the interface in which the $IrO_x$ film 15 makes a contact with the PZT film 14. As a result of the planarization of the interface between the $IrO_x$ film 15 and the PZT film 14, there occurs an increase in the effective voltage applied to the PZT film 14 when a voltage is applied to the ferroelectric capacitor. It is believed that this increase of the effective voltage results in the improvement of the capacitor characteristics.

Next, evaluation is made on the constraints to be imposed upon the $IrO_x$ films 15 and 16 in the case a multilayer interconnection structure is provided on an FeRAM having the ferroelectric capacitor of FIG. 1F.

Figure 9:
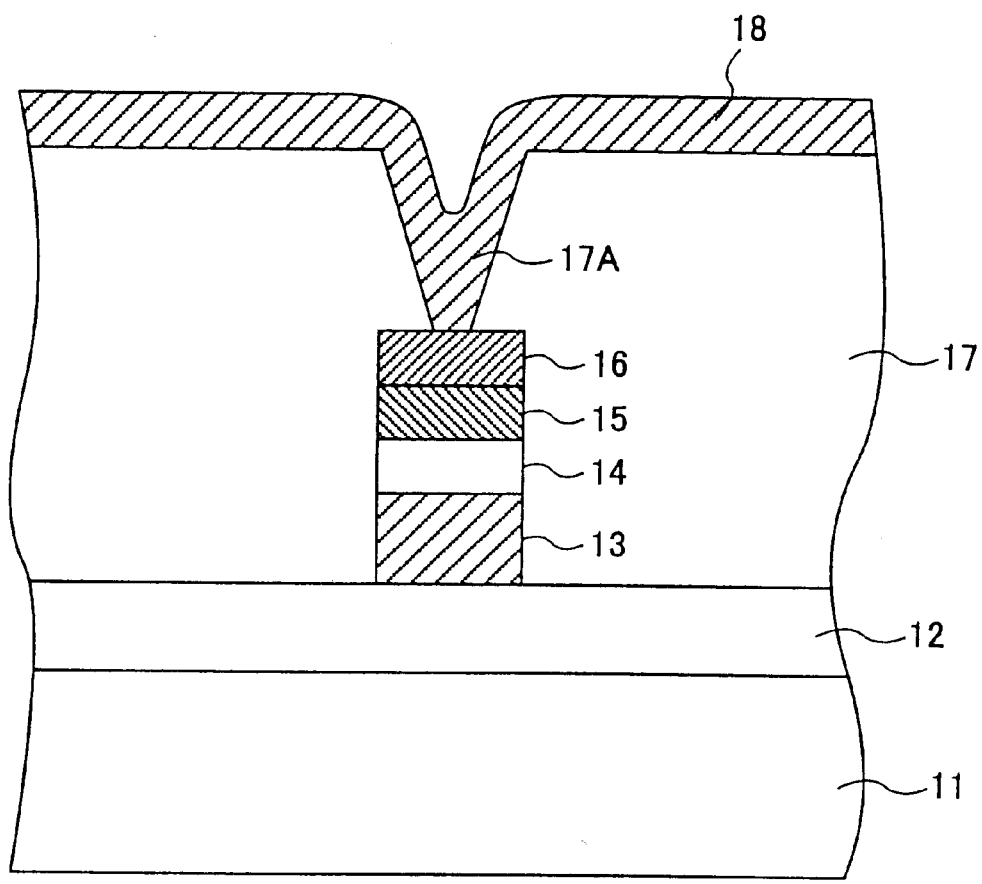
FIG. 9 is a diagram showing a multilayer interconnection structure provided to the ferroelectric capacitor of the first embodiment.

FIG. 9 shows the ferroelectric capacitor of FIG. 1F in the state in which an interlayer insulation film 17 is formed on the Si substrate 11 so as to cover the ferroelectric capacitor and a contact hole 17A is formed in the interlayer insulation film 17 so as to expose the $IrO_x$ film 16 after planarization. In the state of FIG. 9, an interconnection pattern 18 of Al is formed on the interlayer insulation film 17 so as to make a contact with the $IrO_x$ film 16 at the contact hole 17A.

Figure 10:
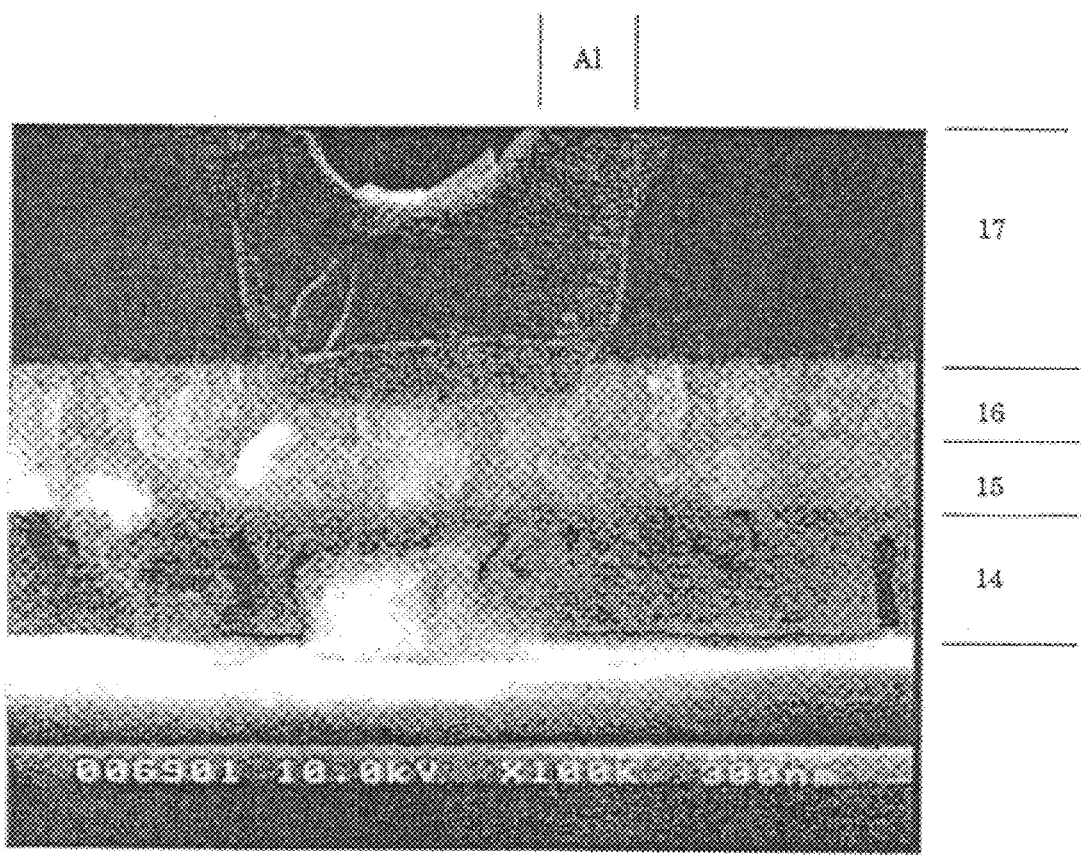
FIG. 10 is a diagram showing an SEM image of the contact hole of FIG. 9 in an enlarged scale.

When forming a contact hole 17A in the interlayer insulation film 17 in an FeRAM integrated circuit device in which a large number of ferroelectric capacitors are formed on the Si substrate 11, the dry etching process used for forming the contact hole 17A is continued for a duration slightly longer than the duration for exposing the surface of the $IrO_x$ film 16 for ensuring the contact in view of possible variation of thickness of the interlayer insulation film 17 or the height of individual ferroelectric capacitors. As a result, there is formed a depression in the $IrO_x$ film 16 in correspondence to the bottom part of the contact hole 17A as shown in FIG. 10, and the Al interconnection pattern is caused to make a contact with the $IrO_x$ film 16 at such a depression. In the photograph of FIG. 9, it can be seen that there is formed a TiN barrier layer 17A in the part in which the Al interconnection pattern 18 makes a contact with the $IrO_x$ film 16.

When forming such a contact structure to the multilayer interconnection structure, the depth of the depression formed in the $IrO_x$ film 16 can becomes as large as several ten nanometers. In the example of the drawing, the depth of the depression is about 50 nm. Thus, when the thickness of the $IrO_x$ film 16 is smaller than 50 nm, there is a risk that the $IrO_x$ film 15 is exposed at the depression, while when this occurs, there arises a problem in that hydrogen or other reducing components cause penetration into the IrOx film 15 through the contact hole and the characteristics of the PZT film 14 are degraded. Because of this, it is necessary to secure a thickness of several ten nanometers or more for the $IrO_x$ film 16.

By taking a contact with the multilayer interconnection structure at the IrOx film 16 forming the upper layer part of the upper electrode as such, the problem of non-oxidizing atmosphere used at the time of formation of the multilayer interconnection structure or formation of the contact hole reaching the ferroelectric film in the ferroelectric capacitor is effectively blocked by $IrO_x$ film 16 having the process-damage resistance.

In the above explanation, a Pt/Ti layered structure is used as the lower electrode 13. However, the lower electrode is by no means limited to such a Pt/Ti electrode, but Ir or Ru, or a conductive oxide such as $RuO_2$ or $SrRuO_3$, or a layered structure of these, may be used for the lower electrode.

Furthermore, it is possible to use other conductive oxide films having a non-stoichiometric composition such as a $RuO_x$ film or a $SrRuO_x$ film for the lower layer part of the upper electrode 15, in addition to the $IrO_x$ film. Further, it is possible to use a conductive oxide film other than the $IrO_x$ film such as a $RuO_x$ film or a $SrRuO_x$ film having a composition closer to the stoichiometric composition as compared with the lower layer part 15, for the upper layer part 16 of the upper electrode.

Further, it is possible to use a PLZT film, an SBT ($SrBi_2(Ta, Nb)_2O_9$) film, or a Bi layered compound, in place of the PZT film 14 in the present embodiment.

[Second Embodiment]

FIGS. 11A–11E show the fabrication process of an FeRAM according to a second embodiment of the present invention.

Figure 11A:
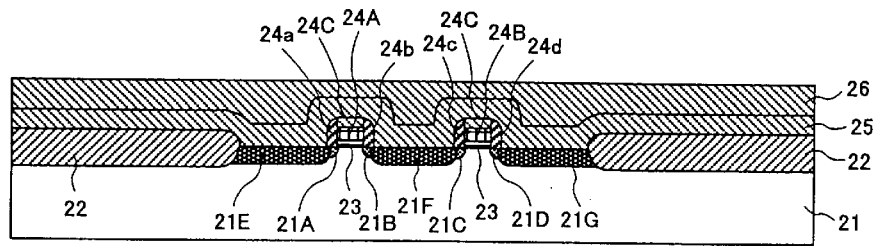

Referring to FIG. 11A, an active region is defined on a Si substrate 21 by a device isolation film 22, and gate electrodes 24A and 24B are formed on the Si substrate 21 as a part of the word line of the FeRAM such that the gate electrodes 24A and 24B extend over the active region covered with a gate insulation film 23. Each of the gate electrodes 24A and 24B carries a low-resistance silicide layer 24C, and LDD regions 21A and 21B are formed in the Si substrate 21 at both lateral sides of the gate electrode 24A. Similarly, LDD regions 21C and 21D are formed in the Si substrate 21 at both lateral sides of the gate electrode 24B.

The gate electrodes 24A and 24B have sidewall insulation films 24a and 24b, and 24c and 24d on respective sidewall surfaces, and a diffusion region 21E is formed in the Si substrate 21 generally in correspondence to the outer edge of the sidewall insulation film 24a. Similarly, a diffusion region 21G is formed in the Si substrate 21 generally in correspondence to the outer edge of the sidewall insulation film 24d. Further, a diffusion region 21F is formed in the Si substrate 21 between the outer edge of the sidewall insulation film 24b and the outer edge of the sidewall insulation film 24c.

The gate electrodes 24A and 24B are covered by a SiON film 25 formed on the Si substrate 21 so as to cover the active region and the device isolation film 22, and an interlayer insulation film 26 of $SiO_2$ is formed on the SiON film 25 by a CVD process with a thickness of about 1000 nm.

After formation, the interlayer insulation film 26 is planarized by a CMP process, and a degassing process is conducted by a heat treatment process at 600° C. for 30 minutes in an $N_2$ atmosphere.

Figure 11B:
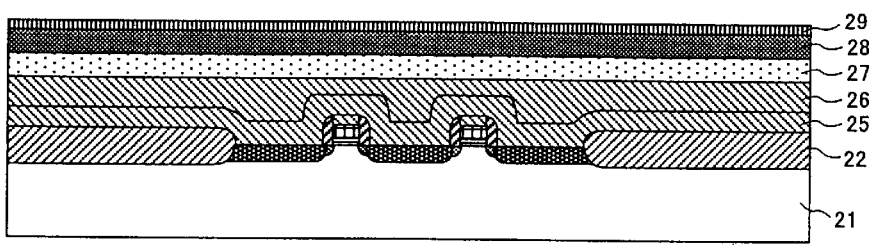

Next, in the step of FIG. 11B, a lower electrode 27 having the Pt/Ti layered structure is formed on the interlayer insulation film 26 by sputtering a Ti film and a Pt film consecutively with respective thicknesses of about 20 nm and about 175 nm individually. As explained before, the lower electrode 27 is not limited to the one having the Pt/Ti layered structure, but may be formed of a lamination of one or more of an Ir film, a Ru film, a $RuO_2$ film or a $SrRuO_3$ film, and the like.

In the step of FIG. 11B, the ferroelectric film 28 of PZT or PLZT is then formed to have a thickness of about 200 nm by an R.F. sputtering process. The ferroelectric film 28 thus formed is further subjected to a rapid thermal annealing process at the temperature of about 600° C. in an $Ar/O_2$ atmosphere in the step of FIG. 11B. As a result, there occurs a partial crystallization in the ferroelectric film 28.

After such a thermal annealing process of the ferroelectric film 28, a reactive sputtering of an $IrO_x$ film is conducted under a condition summarized in Table 1 in the process of FIG. 11B, and an $IrO_x$ film 29 constituting a lower layer part of the upper electrode is formed on the ferroelectric film 28. The $IrO_x$ film 29 thus was formed has a non-stoichiometric composition characterized by a compositional parameter x of about 1.4 (x≈1.4).

In the step of FIG. 11B, a rapid thermal annealing process is further conducted, after the formation of the $IrO_x$ film 29, in an $O_2$ atmosphere at 725° C., and the ferroelectric film 28 undergoes a full crystallization as a result.

Figure 11C:
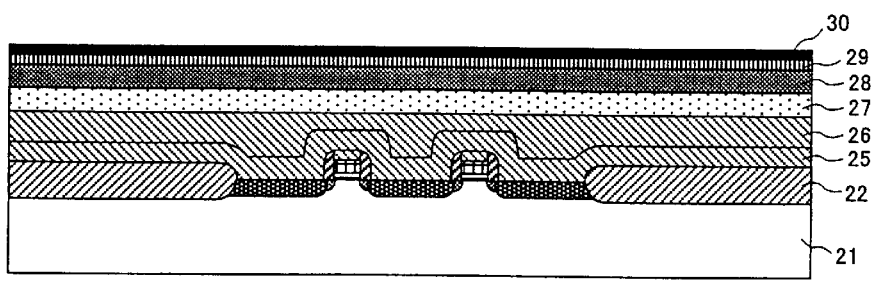

Next, in the step of FIG. 11C, another $IrO_x$ film 30 is deposited on the $IrO_x$ film 29 under the condition explained previously with reference to Table 2. The $IrO_x$ film 30 thus formed has a composition a stoichiometric composition of $IrO_2$ or a composition closer to the stoichiometric composition as compared with the $IrO_x$ film 29.

Next, in the step of FIG. 11D, the films 27–30 are subjected to a patterning process, and ferroelectric capacitors C1 and C2 are formed on the interlayer insulation film 26 as a result.

Further, in the step of FIG. 11E, another interlayer insulation film 31 is formed on the interlayer insulation film 26, and contact holes 31A–31C respectively exposing the diffusion regions 21E, 21F and 21G is formed in the interlayer insulation film 31. The contact holes 31A–31C are then filled up with conductive plugs 31a–31c of W, and the like, so as to make a contact with the diffusion regions 21E–21G, respectively.

In the interlayer insulation film 31, there are formed a contact hole 30D exposing the upper layer part of the $IrO_x$ electrode 30 of capacitor C1 and a contact hole 30E exposing the upper layer part of the $IrO_x$ electrode 30 of the capacitor C2, and Al interconnection patterns 32A–32C are formed on the interlayer insulation film 31, such that the Al interconnection pattern 32A makes a contact with the upper layer part of the IrOx electrode 30 of capacitor C1 at contact hole 30D and a contact with the conductive plug 31a at the contact hole 31A, such that the A1 interconnection pattern 32B makes a contact with the conductive plug 31b at the contact hole 31B, and such that the Al interconnection pattern 32 C makes a contact with the conductive plug 31c at the contact hole 31C and a contact with upper layer part of the $IrO_2$ electrode of the capacitor C2 at the contact hole 30E.

By forming the $IrO_2$ electrode layer 30 on the electrode layer 29 with a composition closer to the stoichiometric composition $IrO_2$ as compared with the electrode layer 29, the non-oxidizing atmosphere used at the time of formation of the contact hole 30D or 30E or the non-oxidizing atmosphere used at the time of formation of the Al interconnection pattern 32A–32C is effectively blocked by the electrode layer 30 of $IrO_x$ or $IrO_2$, and the problem of degradation of the electric characteristics of the ferroelectric film 28 in the capacitors C1 and C2 is avoided.

Further, by using a non-stoichiometric $IrO_x$ film having the compositional parameter x of 1.4 for the lower layer part 29 that makes a direct contact with the ferroelectric film 28, there occurs diffusion of Pb from the ferroelectric film 28 to the $IrO_x$ film 29, and the interface between the ferroelectric film 28 and the $IrO_x$ film 29 is planarized. As a result, the ferroelectric capacitors C1 and C2 show excellent electric characteristics. As explained already with reference to FIGS. 8A and 8B, Pb thus caused diffusion from the ferroelectric film 28 to the $IrO_x$ film 29 do not penetrate into the $IrO_x$ film 30 formed on the $IrO_x$ film 29.

In the description heretofore, explanation was made for the case in the $IrO_x$ is used for the upper electrode layers 29 and 30. However, the present invention is by no means limited to IrOx but it is also possible to use a conductive oxide of $RuO_x$ or $SrRuO_x$ for the upper electrode layers 29 and 30. In this case, it is also possible to use a combination of different oxides of different degree of oxidation for the upper electrode layers 29 and 30.

Hereinafter, the case of using different oxides for the upper layer part 30 of the upper electrode layer and the lower layer part 29 of the upper electrode layer will be described.

For example, it is possible to use a $SrRuO_x$ film as upper layer part 30 of the upper electrode, in the case the lower layer part 29 of the upper electrode is formed under the condition of Table 1 explained before. In this case, the formation of the $SrRuO_x$ film 30 conducted by a sputtering process conducted in an Ar atmosphere, not by a reactive sputtering process conducted in an the oxygen atmosphere for avoiding degradation of surface morphology. When forming the upper layer part 30 by the $SrRuO_x$ layer, it is preferable to set the composition of the upper layer part 30, represented as $SrRuO_{y2}$, with respect to the composition of the lower layer part 29, represented by $IrOx_2$, such that there holds a relationship between the compositional parameters $x_2$ and $y_2$ as $Y_2/3 > x_2/2$.

After the upper layer part 30 of the upper electrode is thus formed, a rapid thermal annealing process is conducted in an $O_2$ atmosphere at 725° C. for 20 seconds, and the ferroelectric film 28 is fully crystallized as a result. Further, an annealing processing is conducted in an oxygen atmosphere at 650° C. for 60 minutes so as to cause oxidation of the $SrRuO_3$ electrode layer 30. It should be noted that, in the case a furnace annealing process is applied directly to the $SrRuO_x$ film, there is a tendency that a surface anomaly develops in the surface of the $SrRuO_x$ film. In order to avoid this problem of surface anomaly, the present invention first conducts the rapid thermal annealing process, in which there occurs no development of surface anomaly, and then a furnace annealing process at a temperature lower than then the temperature used in the rapid thermal annealing process. As a result, it becomes possible to obtain a sufficiently oxidized $SrRuO_x$ film without causing the problem of surface anomaly.

It should be noted that there occurs no oxidation in the $IrO_x$ film even when such the furnace annealing process is conducted over a long time, as a high temperature exceeding 1000° C. is needed in order to cause oxidation of Ir. Thus, the proportion of the metallic state Ir contained in the IrOx electrode layer 29 does not change with such a furnace annealing process. Thus, an electrode structure characterized by higher oxygen content at the upper layer part as compared with the lower layer part is obtained similarly to the embodiment described previously.

In order to obtain the texture shown in FIGS. 5A and 5B in which the degree of oxidation is changed between the upper layer part 30 and lower layer part 29, it is sufficient to change the flow-rate ratio of $Ar/O_2$ in accordance with the conditions summarized in Tables 1 and 2 at the time formation of the lower layer part 29 and the upper layer part 30 of the upper electrode. Alternatively, it is possible to change the sputtering power or substrate temperature according to the conditions of Tables 1 and 2. Generally, the proportion of metallic state Ir in the $IrO_x$ film increases when the sputtering power is increased. Further, the proportion of metallic state Ir in the $IrO_x$ film is decreased when the substrate temperature is increased.

In the present invention, it should be noted that the respective thicknesses of the electrode films 29 and 30 forming the upper electrode of the ferroelectric capacitor or the total thickness of the electrode films 29 and 30 of the upper electrode is not limited to those descried in the present embodiment.

Further, as shown in the modification of FIG. 12, it is possible to pattern the lower layer part 29 of the $IrO_x$ upper electrode layer after formation of the layer 29 and then form the upper layer part 30 of $IrO_x$ thereon. In FIG. 12, it should be noted that those parts corresponding to the parts described previously are designated by the same reference numerals and the description thereof will be omitted.

In the present invention, it should be noted that the lower layer part 15 or 29 can be formed by a reactive sputtering process that uses a target selected from any of Ir, Ru, Pt, Pd, Os, SrRuOx, InTaO$_x$ or an alloy thereof. Further, the upper layer part 16 or 30 can be formed by a reactive sputtering process that uses a target selected from any of Ir, Ru, Pt, Pd, Os, SrRuO$_x$, InTaO$_x$, and an alloy thereof.

Further, the present invention is not limited to those embodiments described heretofore, but various variations and modifications may be made without departing from the scope of the invention.

What is claimed is:

1. A semiconductor device, comprising:

a substrate; and a ferroelectric capacitor provided over said substrate, said ferroelectric capacitor comprising:

a lower electrode, a ferroelectric film provided over said lower electrode, and an upper electrode provided over said ferroelectric film, said upper electrode comprising:

a first layer of an oxide having a stoichiometric composition represented by a formula AO$_{x1}$ by using a compositional parameter x$_1$ and an actual composition represented by a formula AO$_{x2}$ by using a compositional parameter x$_2$; and a second layer of an oxide provided on said first layer and having a stoichiometric composition represented by a formula BO$_{y1}$ by using a compositional parameter y$_1$ and an actual compositional represented by a formula BO$_{y2}$ by using a compositional parameter y$_2$, wherein said first layer is between said lower electrode and said second layer, and there holds a relationship of $y_2/y_1 > x_2/x_1$.

2. A semiconductor device as claimed in claim 1, wherein each of said first and second layers comprises a conductive oxide.

3. A semiconductor device as claimed in claim 1, wherein said first layer comprises a metal element that also constitutes said second layer.

4. A semiconductor device as claimed in claim 3, wherein said metal element is selected from the group consisting of Ir, Ru, Pt, Pd, Os, Sr and Ta.

5. A semiconductor device as claimed in claim 3, wherein said first layer has a composition represented as IrO$_{x2}$ (x$_2$<2), and wherein said second layer has a composition represented as IrO$_{y2}$ (y$_2$>x$_2$).

6. A semiconductor device as claimed in claim 1, wherein a metal element constituting said first layer and a metal element constituting said second element are different.

7. A semiconductor device as claimed in claim 6, wherein said first layer has a stoichiometric composition of IrO$_2$ and an actual composition represented as IrO$_{x2}$ (x$_2$<2), said second layer has a stoichiometric composition of SrRuO$_3$ and an actual composition represented as SrRuO$_{y2}$, wherein there holds a relationship y$_2$/3>x$_2$/2.

8. A semiconductor device as claimed in claim 1, wherein said ferroelectric film is selected from the group consisting of a PZT film, an SBT film and a Bi layered compound.

9. A semiconductor device as claimed in claim 1, wherein said first layer has a granular microstructure and wherein said second layer has a columnar microstructure with a crystal diameter of 20–50 nm.

10. A semiconductor device as claimed in claim 1, wherein said first layer has a thickness of 100 nm or less.

11. A semiconductor device as claimed in claim 1, wherein there is formed a planar interface between said ferroelectric film and said first layer.

12. A semiconductor device as claimed in claim 1, wherein said first layer contains Pb and said second layer is substantially free from Pb.

13. A semiconductor device as claimed in claim 1, further comprising a multilayer interconnection structure provided on said substrate so as to cover said ferroelectric capacitor, said second layer being connected to an interconnection pattern in said multilayer interconnection structure via a contact hole.

* * * * *